United States Patent
Shimura et al.

(10) Patent No.: US 9,024,508 B2
(45) Date of Patent: May 5, 2015

(54) BENDING VIBRATION PIECE, METHOD FOR MANUFACTURING THE SAME AND ELECTRONIC DEVICE

(75) Inventors: Masashi Shimura, Suwa (JP); Takayuki Kikuchi, Okaya (JP)

(73) Assignee: Seiko Epson Corporation (JP)

( * ) Notice: Subject to any disclaimer, the term of this patent is extended or adjusted under 35 U.S.C. 154(b) by 212 days.

(21) Appl. No.: 13/533,511

(22) Filed: Jun. 26, 2012

(65) Prior Publication Data

US 2012/0326571 A1 Dec. 27, 2012

(30) Foreign Application Priority Data

Jun. 27, 2011 (JP) .................................. 2011-141480

(51) Int. Cl.
*H03H 9/21* (2006.01)
*H01L 41/09* (2006.01)
*H03H 3/02* (2006.01)

(52) U.S. Cl.
CPC . *H03H 3/02* (2013.01); *H03H 9/21* (2013.01); *H03H 2003/026* (2013.01)

(58) Field of Classification Search
CPC ............. H03H 3/04; H03H 9/19; H03H 9/09; H03H 9/215; H03H 9/21; H03H 9/1021; H03H 2/003; H03H 2/026; H01L 41/0926; G04F 5/063; G01C 19/5607
USPC ............ 310/312, 330, 370; 73/514.34, 514.3, 73/514.21, 514.13, 504.16
See application file for complete search history.

(56) References Cited

U.S. PATENT DOCUMENTS

| 4,379,244 | A | * | 4/1983 | Dinger | 310/312 |
| 5,668,317 | A | | 9/1997 | Farine et al. | |
| 6,101,878 | A | * | 8/2000 | Watarai | 73/504.16 |
| 6,874,348 | B2 | | 4/2005 | Omawari et al. | |
| 7,723,901 | B2 | * | 5/2010 | Inaguma et al. | 310/330 |
| 2006/0087205 | A1 | | 4/2006 | Kikushima | |
| 2010/0164332 | A1 | * | 7/2010 | Kawanishi | 310/370 |
| 2011/0025166 | A1 | * | 2/2011 | Aratake | 310/312 |
| 2012/0126664 | A1 | * | 5/2012 | Ogura et al. | 310/312 |

FOREIGN PATENT DOCUMENTS

| JP | 09-014973 | | 1/1997 | |
| JP | 10-170274 | * | 6/1998 | ............. G01C 19/56 |
| JP | 11-351874 | | 12/1999 | |
| JP | 2002-243451 | | 8/2002 | |
| JP | 2002-340559 | | 11/2002 | |
| JP | 2005-039671 | A | 2/2005 | |
| JP | 2006-148856 | A | 6/2006 | |
| JP | 2006-214779 | | 8/2006 | |
| JP | 2007-093400 | | 4/2007 | |

* cited by examiner

*Primary Examiner* — Thomas Dougherty
(74) *Attorney, Agent, or Firm* — Harness, Dickey & Pierce, P.L.C.

(57) ABSTRACT

A double-side tuning fork-type bending vibration piece having a basal part, a pair of drive vibration arms, a pair of detection vibration arms, drive electrodes and detection electrodes includes adjustment films of a metallic material or the like formed in connecting areas between the vibration arms and the basal part. The adjustment films are formed in such a way as to cover an area of tapered portions formed in connecting parts between the drive vibration arms and the basal part, an area of the basal part near the tapered portions and an area of the drive vibration arms. While monitoring a detection current outputted from the detection electrodes when the drive vibration arms are excited in driving mode, the adjustment films are partly deleted by laser irradiation so that the detection current becomes 0.

6 Claims, 7 Drawing Sheets

BENDING VIBRATION PIECE, METHOD FOR MANUFACTURING THE SAME AND ELECTRONIC DEVICE

BACKGROUND

1. Technical Field

The present invention relates to a bending vibration piece having a vibration arm which performs bending vibration and a method for manufacturing the same. The invention also relates to various electronic devices using this bending vibration piece.

2. Related Art

According to related arts, a piezoelectric device such as oscillator or real-time clock module equipped with a piezoelectric vibrator, piezoelectric vibration piece and IC chip as a clock source for an electronic circuit is broadly used in electronic devices such as timepieces, consumer electronics, various information and communication devices and office automation appliances. Also, in various electronic devices such as digital still camera, video camera, navigation device, vehicle body attitude detection device, pointing device, game controller, mobile phone and head-mounted display, a sensor such as piezoelectric vibration gyro using a bending vibration piece is widely used to detect physical quantities such as angular velocity, angular acceleration, acceleration and forces.

As a bending vibration piece for a piezoelectric vibration gyro, a tuning fork-type bending vibration piece having a pair of vibration arms extending parallel to each other from a basal part is known (see, for example, JP-A-9-14973 and JP-A-2002-340559). Also a double-side tuning fork-type bending vibration piece having a pair of drive vibration arms extending parallel to each other on one side from a basal part and a pair of detection vibration arms extending parallel to each other on the other side is known (see, for example, JP-A-2002-340559 and JP-A-2007-93400).

Many bending vibration pieces are formed by photoetching a wafer of a piezoelectric single crystal material, for example, crystal or the like, to work the wafer into a desired outer shape and then patterning an electrode film on a surface of the wafer. Since the piezoelectric single crystal material such as crystal has etch anisotropy, the vibration arms have a bilaterally asymmetrical shape instead of having an ideal rectangular cross-section. Also, if there is misalignment of a photomask in the working of the outer shape of the bending vibration piece, the cross-section of the vibration arms may become vertically asymmetrical in the direction of thickness. In such vibration arms with an asymmetrical cross-section, a tensile force and a compressive force due to an electric field generated inside by an alternating current applied to drive electrodes act in an unbalanced way between the upper side and lower side of the cross-section. Therefore, the vibration arms perform bending vibration in a direction of width while being displaced in an out-of-plane direction, that is, a direction of thickness, instead of an in-plane direction parallel to main surfaces of the vibration arms.

In the tuning fork-type vibration piece, vibration of the vibration arms in the in-plane direction causes a vibration leakage on the basal part side and leads to a rise in CI value or variation in CI value among vibration pieces. Also, in the bending vibration piece for a piezoelectric vibration gyro, when the drive vibration arms vibrate in the out-of-plane direction in driving mode, the detection vibration arms vibrate unnecessarily and a detection signal is outputted even when the vibration piece does not rotate. Therefore, detection sensitivity and accuracy are lowered.

To solve such a vibration leakage, bending vibration pieces with various measures are developed. For example, an angular velocity sensor which includes a vibrator made up of a piezoelectric body formed in the shape of a tuning fork including a pair of arm portions and a connecting portion connecting the arm portions, in which a ridgeline near the base of the arm portions is cut by machining so as to take weight balance between the two arm portions, is known (see, for example, JP-A-11-351874). Moreover, a technique of achieving a surface roughness of 2 μm or less in the ground part of the ridgeline of the arm portions in this angular velocity sensor and thus taking precise weight balance between the two arm portions and improving output characteristics is known (see, for example, JP-A-2002-243451).

When the vibration arms of the bending vibration piece are mechanically cut in this way, work dust generated in the cutting may re-attach to the vibration arms, deteriorate vibration characteristics and thereby lower detection accuracy. Thus, a method for manufacturing a vibrating body, including forming an electrode on a vibrating body that is worked in an outer shape thereof, forming a protection film thereon, then working and removing a portion of the vibrating body, and then removing the protection film to remove re-attached dust, is known (see, for example, JP-A-2006-214779).

Moreover, mechanical cutting may damage the vibration piece and it is difficult to control the amount of working accurately to remove a vibration leakage. Thus, a technique of depositing silicon dioxide, metallic material or the like by vapor deposition or the like on a corner part of the base part of the vibration arm situated on the side to which the direction of vibration of the vibration piece is inclined when the vibration piece vibrates in the out-of-plane direction in driving mode, thus increasing the rigidity of this part to make this part harder to deform, modifying the direction of vibration and removing a vibration leakage, is known (see, for example, JP-A-10-170274).

However, in the above related-art technique of removing a vibration leakage, the work of adjusting the amount of a substance attached to the corner part of the base part of the vibration arm in accordance with the magnitude of leak vibration and controlling the rigidity of this part to remove the leak vibration is very difficult in practice. Particularly when the vibration piece is downsized, it is more difficult to control the attachment of a substance.

SUMMARY

An advantage of some aspects of the invention is that a bending vibration piece in which a vibration leakage due to out-of-plane vibration of vibration arms can be removed relatively easily and effectively even when the bending vibration piece is downsized and a method for manufacturing the same are provided.

An aspect of the invention is directed to a method for manufacturing a bending vibration piece including: working a wafer into a vibration element piece having an outer shape of a bending vibration piece having at least one vibration arm extending from a basal part; patterning an excitation electrode for exciting the vibration arm, and an electrode pad and wiring for connecting the excitation electrode with outside, on a surface of the resulting vibration element piece; and adding mass to a connecting area between the vibration arm and the basal part or reducing mass of the connecting area.

Since the connecting area between the vibration arm and the basal part can secure a broader area than the vibration arm, the addition or reduction of mass can be carried out relatively easily. Since this addition or reduction of mass enables change in the rigidity of the connecting area between the vibration arm and the basal part, concentration of internal stress generated in this area can be relaxed and a vibration leakage can be removed effectively.

In one embodiment, the connecting area between the vibration arm and the basal part is an area where internal stress is generated by vibration when the vibration arm is excited. Thus, concentration of internal stress caused by in-plane vibration of the vibration arm can be relaxed more effectively and a vibration leakage can be removed more effectively.

In one embodiment, the bending vibration piece has a tapered portion tapered toward a distal end of the vibration arm, in a connecting part between the vibration arm and the basal part, and the connecting area between the vibration arm and the basal part includes an area of at least the tapered portion. Thus, concentration of internal stress caused by in-plane vibration of the vibration arm can be relaxed effectively.

In one embodiment, the connecting area between the vibration arm and the basal part includes an area of the tapered portion and an area of the basal part near the tapered portion. Thus, even when the bending vibration piece is downsized, distribution of internal stress can be adjusted without affecting the electrode of the vibration arm.

In one embodiment, an adjustment film is deposited in the connecting area between the vibration arm and the basal part, thereby adding mass to the connecting area. Thus, the rigidity of the area can be increased relatively easily and distribution of internal stress can thus be relaxed. Therefore, a vibration leakage can be removed effectively.

In one embodiment, the method further includes partly deleting the adjustment film. Thus, distribution of internal stress can be adjusted suitably and finely and a vibration leakage can be removed more effectively.

In one embodiment, the adjustment film is formed, at least partly superimposed on at least one of the electrode pad and the wiring. Thus, even when the bending vibration piece is downsized, the area of the basal part can be used effectively.

In one embodiment, a surface of the connecting area between the vibration arm and the basal part is deleted and mass of the connecting area is reduced. Thus, distribution of internal stress can be relaxed and a vibration leakage can be removed effectively.

Another aspect of the invention is directed to a bending vibration piece including a basal part, at least one vibration arm extending from the basal part, an excitation electrode for exciting the vibration arm, and an adjustment film formed in a connecting area between the vibration arm and the basal part for adjusting distribution of internal stress generated by vibration when the vibration arm is excited. Thus, the rigidity of the connecting area between the vibration arm and the basal part can be increased and concentration of internal stress generated in this area can be relaxed. Therefore, a vibration leakage can be removed effectively.

In one embodiment, a tapered portion tapered toward a distal end of the vibration arm is further provided in a connecting part between the vibration arm and the basal part, and the adjustment film is formed in an area including at least the tapered portion. Thus, distribution of internal stress can be relaxed effectively in accordance with the area where internal stress occurs, and a vibration leakage can be removed effectively.

In one embodiment, the adjustment film is formed in an area of the tapered portion and an area of the basal part near the tapered portion. Thus, the adjustment film can be formed more easily and a vibration leakage can be removed more effectively.

In one embodiment, the adjustment film is deleted at least partly. Thus, a vibration leakage can be removed more accurately.

Still another aspect of the invention is directed to a bending vibration piece including a basal part, at least one vibration arm extending from the basal part, and an excitation electrode for exciting the vibration arm, wherein a surface of a connecting area between the vibration arm and the basal part is partly deleted in order to adjust distribution of internal stress generated by vibration when the vibration arm is excited, is provided. Thus, concentration of internal stress generated in the connecting area between the vibration arm and the basal part can be relaxed and a vibration leakage can be removed effectively.

In one embodiment, a tapered portion tapered toward a distal end of the vibration arm is further provided in a connecting part between the vibration arm and the basal part, and a surface of an area including at least the tapered portion is deleted. Thus, distribution of internal stress can be adjusted more effectively.

In one embodiment, a surface of the tapered portion and a portion of the basal part near the tapered portion is partly deleted. Thus, distribution of internal stress can be adjusted without affecting the electrode of the vibration arm.

Yet another aspect of the invention is directed to an electronic device having the above bending vibration piece. Thus, an electronic device which has a device such as high-performance high-accuracy sensor element and can be downsized can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
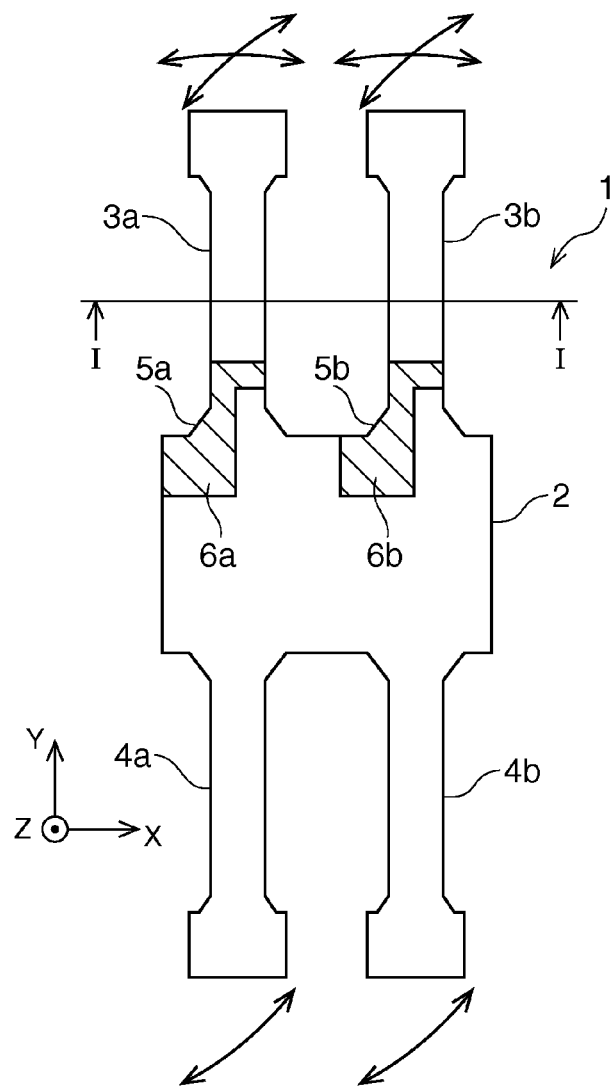
FIG. 1A is a schematic plan view showing a bending vibration piece according to a first embodiment of the invention.

Hereinafter, preferred embodiments of the invention will be described in detail with reference to the accompanying drawings. In the accompanying drawings, the same or similar elements are denoted by the same or similar reference numerals.

FIG. 1A schematically shows a double-side tuning fork-type bending vibration piece for a piezoelectric vibration sensor used for, for example, an angular velocity sensor, according to a first embodiment of the invention. A bending vibration piece 1 has a roughly rectangular basal part 2 at the center, a pair of drive vibration arms 3a, 3b extending parallel to each other toward one side from the basal part 2, and a pair of detection vibration arms 4a, 4b extending parallel to each other toward the opposite side. In connecting parts between the drive vibration arms 3a, 3b and the basal part 2, tapered portions 5a, 5b tapered toward distal ends of these vibration arms are formed on both left and right sides.

In the drive vibration arms 3a, 3b, a drive electrode (not shown) is formed in order to cause the drive vibration arms to perform bending vibration in directions toward and away from each other within an XY plane that is the same as main surfaces of the drive vibration arms, in driving mode. In the detection vibration arms 4a, 4b, a detection electrode (not shown) is formed in order to detect a potential difference generated when the detection vibration arms perform bending vibration in opposite directions to each other in Z-axis directions perpendicular to main surfaces of the detection vibration arms, in detection mode.

Figure 2:
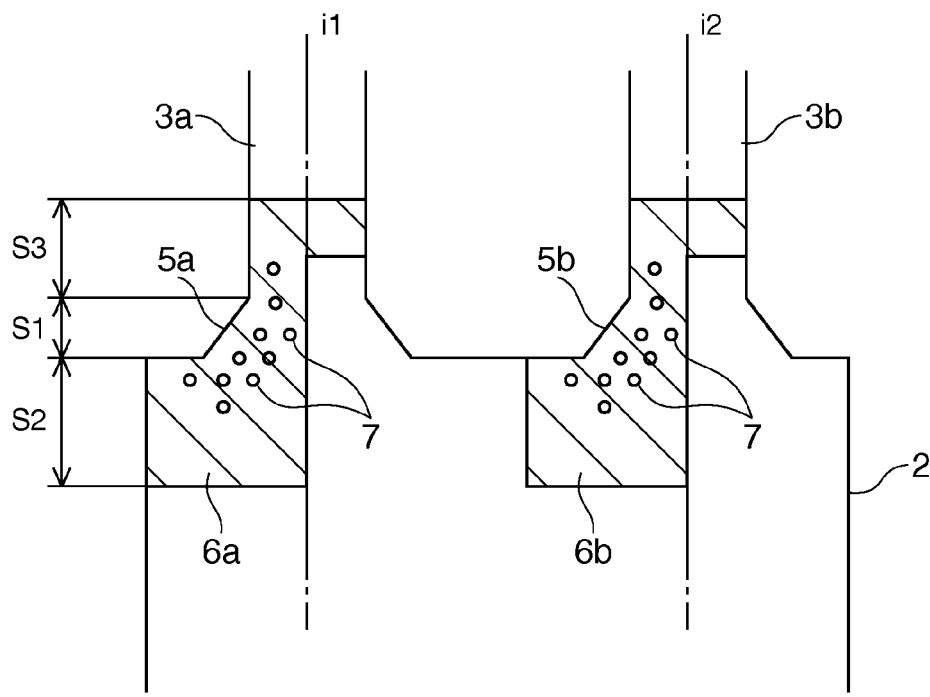
FIG. 2 is a partially enlarged plan view schematically showing essential parts of the first embodiment.

On one surface of the bending vibration piece 1, for example, on a face side thereof, adjustment films 6a, 6b are formed respectively in the connecting areas between the drive vibration arms 3a, 3b and the basal part 2. The adjustment films 6a, 6b are formed continuously across an area S1 of the tapered portions 5a, 5b, an area S2 of the basal part 2 near the tapered portions, and an area S3 of the drive vibration arms 3a, 3b near the tapered portions, as viewed in a longitudinal direction of the bending vibration piece 1 as shown in FIG. 2. In the whole of the area S1 of the tapered portions and the area S2 of the basal part and a portion of the area S3 of the drive vibration arms, the adjustment films are provided only to one side of vibration centers i1, i2 of the drive vibration arms, that is, to the left side in FIG. 2. Moreover, the adjustment films are partly deleted as indicated by a number of tool marks 7 in FIG. 2.

The adjustment films 6a, 6b can be formed by a technique such as electroplating of a metallic material film such as Au or Ni, for example, on a Cr foundation. Such a metallic material film can be deleted with the amount of working controlled relatively easily, for example, by laser irradiation. The adjustment films can also be formed by sputtering a non-metallic material such as aluminum nitride.

The thickness of the adjustment films 6a, 6b is properly decided according to characteristics of the film material used such as the modulus of elasticity of the film and the rigidity of the film. A highly elastic material can be formed thinly. Preferably, the thickness of the adjustment films is set sufficiently thicker than a typical electrode film, usually to approximately several μm and at least approximately 3 μm. Thus, the rigidity of the portions of the bending vibration piece 1 where the adjustment films are provided can be made higher than the other parts.

The adjustment films 6a, 6b can also be formed, partly or entirely superimposed on electrode parts and/or wiring (not shown) led out onto the basal part 2 from the drive electrodes for external connection. When the adjustment films are metallic film materials, the adjustment films can be formed to configure a portion of the electrode pads and/or wiring. In this case, when the basal part and the drive vibration arms are reduced in plane dimension due to a downsizing of the bending vibration piece 1, the electrodes, electrode pads and wiring that are sufficiently large can be secured.

In driving mode, as a predetermined AC voltage is applied to the drive electrodes, the drive vibration arms 3a, 3b perform bending vibration in opposite directions to each other within an XY plane that is the same as main surfaces thereof. As the bending vibration piece 1 rotates on a Y axis in a longitudinal direction in this state, a Coriolis force corresponding to an angular velocity thereof acts and the drive vibration arms perform bending vibration in opposite directions to each other in Z-axis directions perpendicular to the main surfaces. By resonating with this bending vibration, the detection vibration arms 4a, 4b similarly perform bending vibration in opposite directions to each other in Z-axis directions. By taking out a potential difference generated between the detection electrodes, the rotational and angular velocities of the bending vibration piece 1 or the like are found.

Figure 1B:
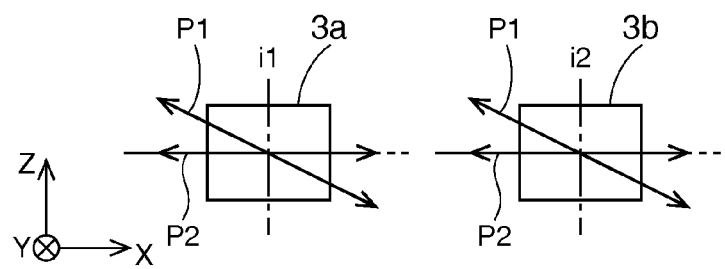
FIG. 1B is a sectional view showing drive vibration arms, taken along line I-I in FIG. 1A.

It is assumed that when the adjustment films 6a, 6b are not provided on the bending vibration piece 1, the drive vibration arms 3a, 3b in driving mode perform bending vibration in out-of-plane directions indicated by arrows P1 in FIG. 1B. In this case, in the connecting areas between the drive vibration arms and the basal part 2, concentration of internal stress occurs in diagonal directions corresponding to the bending vibration directions P1. In this embodiment, the adjustment films 6a, 6b are provided to add mass and increase the rigidity of the area in the diagonal directions. Thus, distribution of internal stress is adjusted and concentration of internal stress is relaxed. Therefore, the direction of vibration of the drive vibration arms 3a, 3b is corrected roughly into the XY-plane, as indicated by arrows P2 in FIG. 1B, and a vibration leakage from the drive vibration arms in driving mode can be restrained effectively.

According to another embodiment, the adjustment films can be formed on both face and back sides of the bending vibration piece 1. In this case, since concentration of stress due to out-of-plane vibration of the drive vibration arms occurs corresponding to the bending vibration direction P1 as described above, the adjustment films on the back side are arranged symmetrically with the adjustment films 6a, 6b on the face side about the vibration centers i1, i2 of the drive vibration arms. According to another embodiment, the adjustment films 6a, 6b can also be extended to lateral parts of the basal part 2 in close proximity to the adjustment films 6a, 6b.

The bending vibration piece 1 of the first embodiment can be manufactured by following procedures below, using a related-art manufacturing method. First, for example, a crystal wafer is worked by photoetching to form a vibration element piece having the outer shape of the bending vibration piece 1. An electrode film is deposited on a surface of the resulting vibration element piece and patterned to form the drive electrodes and detection electrodes, and the electrode pads and wiring led out from these electrodes.

Next, the adjustment films 6a, 6b are deposited in the connecting areas between the drive vibration arms 3a, 3b and the basal part 2. The adjustment films 6a, 6b can be made of a metallic material such as Au or Ni, for example, on a Cr foundation, and can be formed relatively accurately even in very small areas by a technique such as electroplating. The adjustment films can be made of a non-metallic material such as aluminum nitride and can be formed by a technique of sputtering or deposition. The amount of deposition and thickness of the adjustment films can be set within such a range that a vibration leakage from the drive vibration arms in driving mode can be restrained to a certain extent, based on results of an experiment or simulation.

Next, a test current is applied to the drive electrodes to cause the drive vibration arms 3a, 3b to vibrate in driving mode. The adjustment films 6a, 6b are partly deleted while a detection current outputted from the detection electrodes is monitored. Preferably, the deletion of the adjustment films is carried out in the area S1 of the tapered portions 5a, 5b and the area S2 of the basal part 2 so that the drive electrodes and wiring on the drive vibration arms are not damaged or deleted.

When the adjustment films are metallic material films, the deletion can be carried out even in very small areas with the amount of working controlled relatively easily, for example, by laser irradiation. When the adjustment films are non-metallic material films, the deletion can be carried out, for example, by physical etching or the like. Thus, a vibration leakage from the drive vibration arms in driving mode can be adjusted and restrained more securely.

The deletion of the adjustment films 6a, 6b can be carried out in a wafer-state, or before the bending vibration piece 1 is taken as an individual piece from a wafer, or after packaging. By carrying the deletion after packaging, influence at the time of packaging and on the packaging state can be eliminated.

Figure 3:
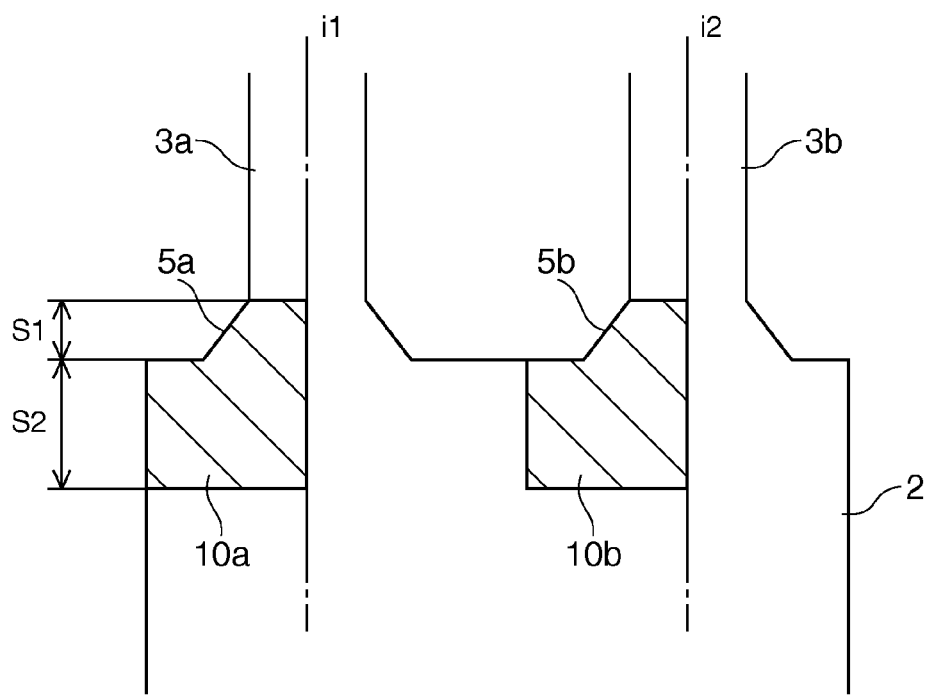
FIG. 3 is a partially enlarged plan view schematically showing an adjustment film of a different pattern from FIG. 2.

The adjustment films can be provided in various other patterns than the first embodiment, on the basal part 2 of the bending vibration piece 1. FIG. 3 schematically shows adjustment films of a different pattern from the first embodiment shown in FIG. 2. Adjustment films 10a, 10b of FIG. 3 are formed by omitting the area S3 of the drive vibration arms 3a, 3b from the adjustment films 6a, 6b of the first embodiment while leaving the area S1 of the tapered portions 5a, 5b and the area S2 of the basal part 2. Thus, an area for the drive electrodes and wiring provided on the drive vibration arms is secured.

Figure 4:
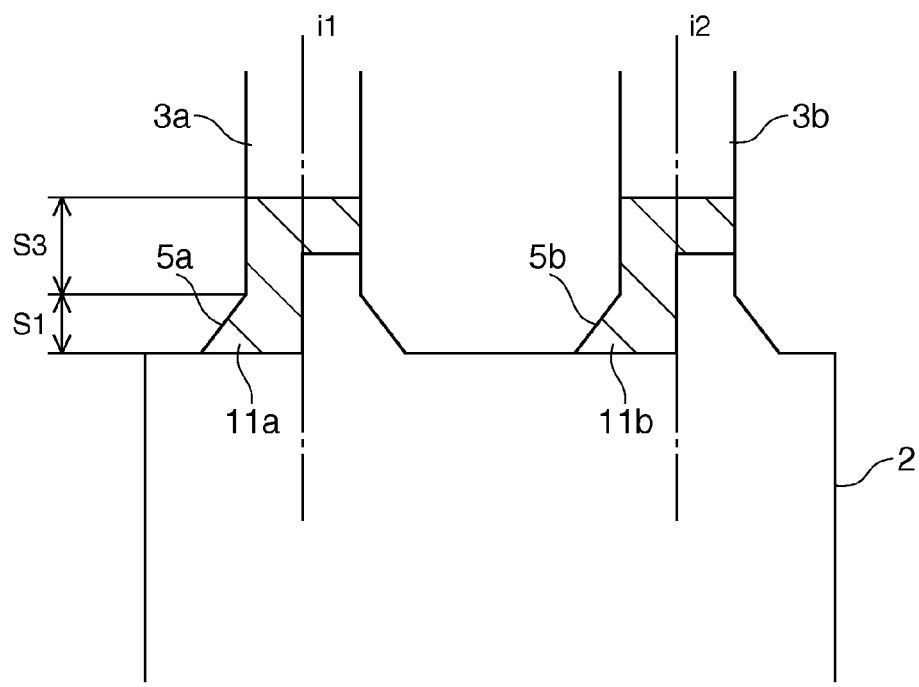
FIG. 4 is a partially enlarged plan view schematically showing an adjustment film of a different pattern from FIG. 2.

FIG. 4 schematically shows adjustment films of another different pattern from the first embodiment of FIG. 2. Adjustment films 11a, 11b of FIG. 4 are formed by omitting the area S2 of the basal part 2 from the adjustment films 6a, 6b of the first embodiment while leaving the area S1 of the tapered portions 5a, 5b and the area S3 of the drive vibration arms 3a, 3b. Thus, a broader area for providing the electrode pads and wiring on the basal part 2 is secured.

Figure 5:
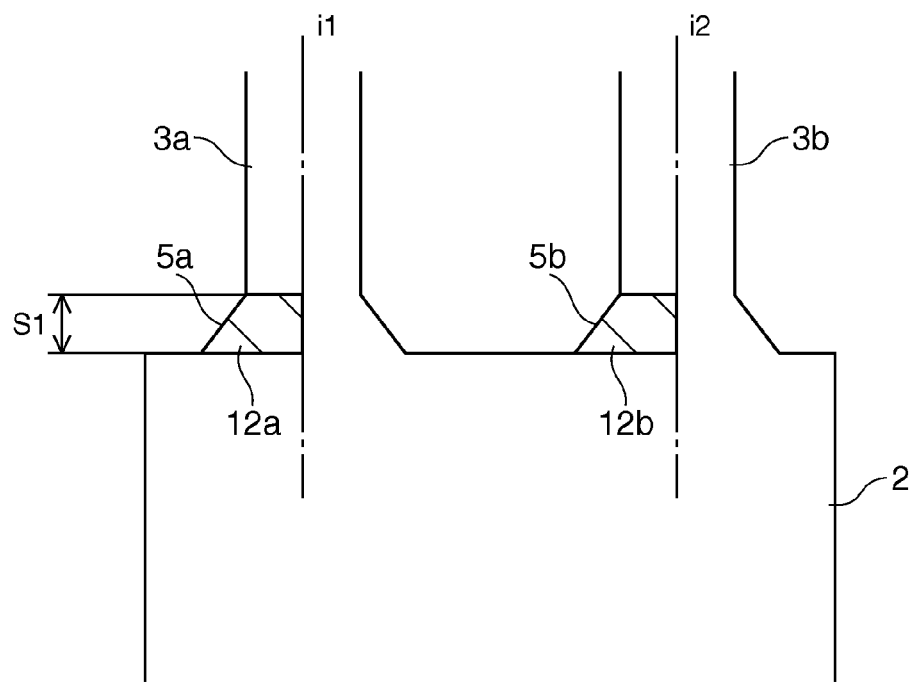
FIG. 5 is a partially enlarged plan view schematically showing an adjustment film of a different pattern from FIG. 2.

FIG. 5 schematically shows adjustment films of another different pattern from the first embodiment of FIG. 2. Adjustment films 12a, 12b of FIG. 5 are formed by omitting the area S2 of the basal part 2 and the area S3 of the drive vibration arms 3a, 3b from the adjustment films 6a, 6b of the first embodiment while only leaving the area S1 of the tapered portions 5a, 5b. Thus, an area for the drive electrodes and wiring on the drive vibration arms and a broad area for the electrode pads and wiring on the basal part 2 are secured.

Figure 6:
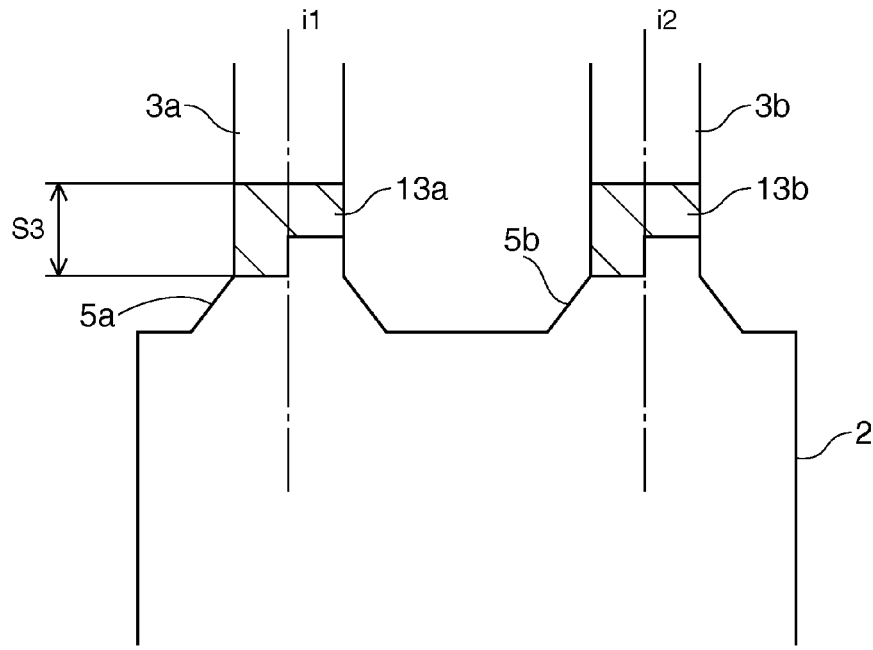
FIG. 6 is a partially enlarged plan view schematically showing an adjustment film of a different pattern from FIG. 2.

FIG. 6 is schematically shows adjustment films of a different pattern from the first embodiment and the above patterns. Adjustment films 13a, 13b of FIG. 6 are formed by omitting the area S1 of the tapered portions 5a, 5b and the area S2 of the basal part 2 from the adjustment films 6a, 6b of the first embodiment while only leaving the area S3 of the drive vibration arms 3a, 3b.

Also, the adjustment films 10a-13a, 10b-13b of the patterns shown in FIGS. 3 to 6 can be formed on both face and back sides of the bending vibration piece 1. As in the first embodiment, the adjustment films on the back side are arranged symmetrically with the adjustment films on the face side about the vibration centers i1, i2 of the drive vibration arms in FIG. 1B. According to another embodiment, the adjustment films can also be extended to lateral parts of the basal part 2 in close proximity to the adjustment films.

With the bending vibration piece 1 having the adjustment films of each pattern of the first embodiment and FIGS. 3 to 6, a detection current outputted from the detection electrode pads as an amount of vibration leakage is simulated when the drive vibration arms 3a, 3b perform bending vibration in driving mode and the bending vibration piece does not rotate on the Y axis. For comparison, a simulation is similarly carried out in a case where the same bending vibration piece as the first embodiment does not have the adjustment films 6a, 6b. Design conditions of the bending vibration piece 1 are as follows.

Figure 7:
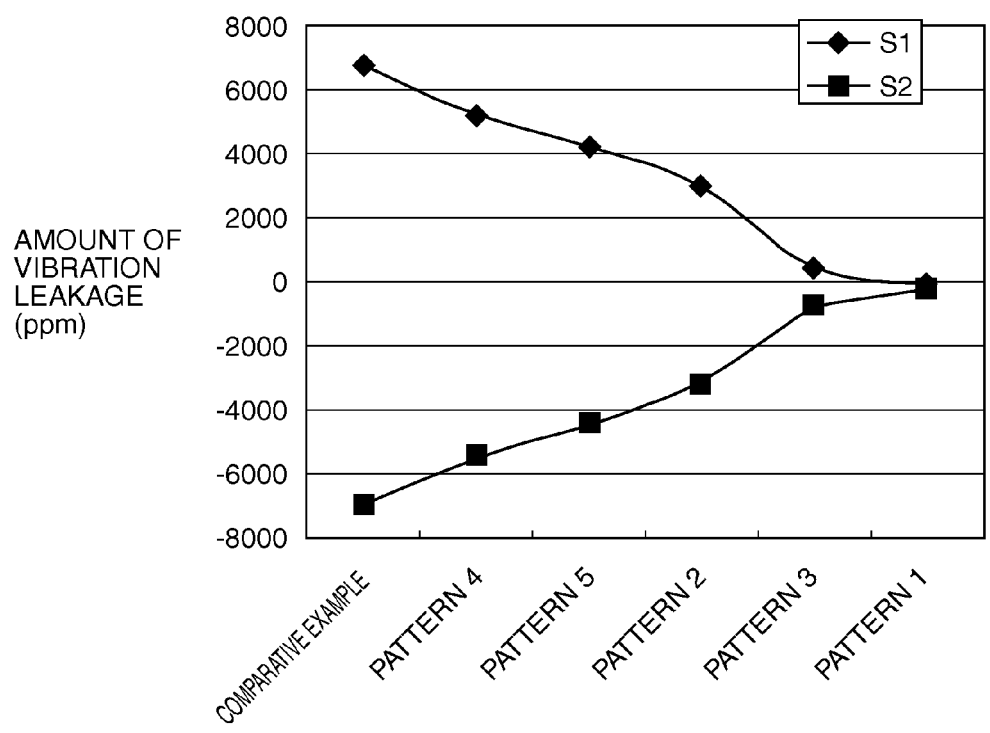
FIG. 7 is a chart showing the amount of vibration leakage from the bending vibration piece having the adjustment film of each pattern shown in the first embodiment and FIGS. 3 to 6.

Full length of vibration piece: 3800 μm
Full width of vibration piece: 1200 μm
Thickness of vibration piece: 200 μm
Drive frequency: 50000 Hz
Detection frequency: 49000 Hz FIG. 7 shows the results of the above simulations. In FIG. 7, the vertical axis represents the rate of a detection current outputted from the detection electrodes in relation to a drive current applied to the drive electrodes, as converted into ppm, as an amount of vibration leakage. S1 shows the magnitude of a detection signal from one detection vibration arm. S2 shows the magnitude of a detection signal from the other detection vibration arm. On the horizontal axis, a pattern 1 represents the first embodiment having the adjustment films 6a, 6b of FIG. 2. A pattern 2 represents the case where the adjustment films 10a, 10b of FIG. 3 are provided. A pattern 3 represents the case where the adjustment films 11a, 11b of FIG. 4 are provided. A pattern 4 represents the case where the adjustment films 12a, 12b of FIG. 5 are provided. A pattern 5 represents the case where the adjustment films 13a, 13b of FIG. 6 are provided.

As shown in FIG. 7, the first embodiment of the pattern 1 has the least amount of vibration leakage and it is confirmed that the amount of vibration leakage is restrained substantially to 0. In the case of the pattern 3, the amount of vibration leakage is larger than in the first embodiment but can be restrained to a sufficiently small value for practical use. In the case of the pattern 2, the amount of vibration leakage is large than in the pattern 1 and the pattern 3 but can be restrained to half of the amount of vibration leakage in the comparative example without the adjustment films or less. In the cases of the patterns 4 and pattern 5, a significant restraining effect of the amount of vibration leakage is confirmed, compared with the comparative example.

Figure 8A:
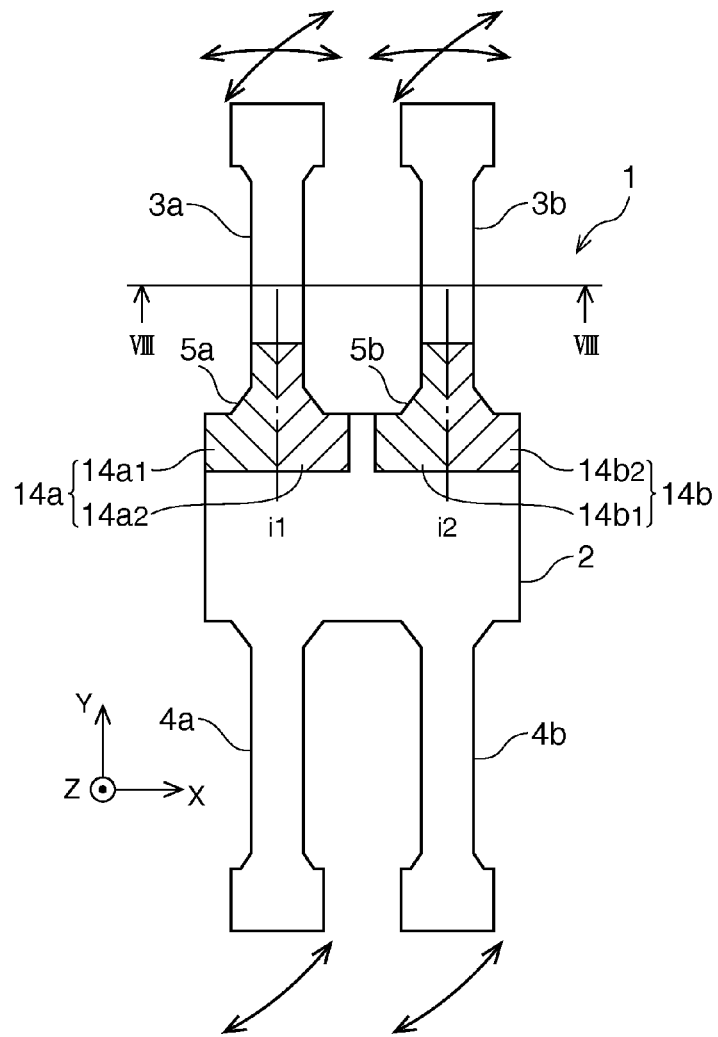
FIG. 8A is a schematic plan view showing a bending vibration piece according to a modification of the first embodiment.

The adjustment films can be provided substantially in the entire connecting areas between the vibration arms and the basal part. FIG. 8A shows a bending vibration piece according to a modification of the first embodiment, with such adjustment films. In FIG. 8A, adjustment films 14a, 14b are provided substantially symmetrically about the vibration centers i1, i2, on both sides in the connecting areas between the vibration arms 3a, 3b and the basal part 2. Also in this embodiment, the adjustment films 14a, 14b can be formed one of the face or back sides of the bending vibration piece 1, or can be formed on both the face and back sides.

In this embodiment, the adjustment films 14a, 14b are respectively divided into two areas each, on the left and right, 14a1, 14a2, 14b1, 14b2, about the vibration centers i1, i2. Each of the adjustment films is partly deleted from one of the left and right areas. Thus, the rigidity can be made higher in the other area than in the one area that is partly deleted. When the adjustment films 14a, 14b are provided on both the face and back sides of the bending vibration piece 1, an area of the adjustment films on the back side that is symmetrical to one of the left and right areas of the adjustment films on the face side about the vibration centers i1, i2 is partly deleted. According to another embodiment, the adjustment films can be extended to lateral parts of the basal part 2 in close proximity of the adjustment films.

Figure 8B:
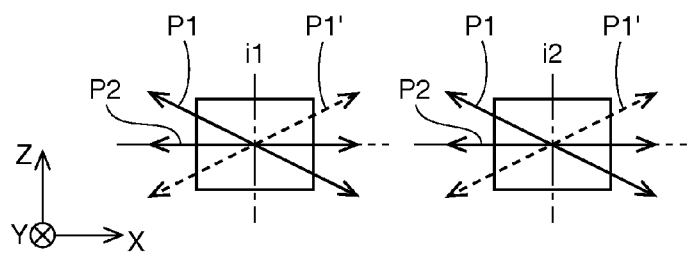
FIG. 8B is a sectional view of vibration arms, taken along line VIII-VIII in FIG. 8A.

When the drive vibration arms 3a, 3b in driving mode perform bending vibration in out-of-plane directions indicated by arrows P1 (solid lines) in FIG. 8B, the right-side areas 14a2, 14b2 of the adjustment films 14a, 14b are partly deleted so that the rigidity of areas in diagonal directions corresponding to the directions of vibration P1 is increased. When the drive vibration arms performs bending vibration in out-of-plane directions indicated by arrows P1' (broken lines), the left-side areas 14a1, 14b1 of the adjustment films on the opposite side are partly deleted so that the rigidity of areas in diagonal directions corresponding to the directions of vibration P1' is increased. Thus, distribution of internal stress in the bending vibration piece 1 in driving mode is adjusted and concentration of internal stress is relaxed. The direction of vibration of the drive vibration arms 3a, 3b is thus corrected roughly into the XY plane as indicated by arrows P2. Thus, a vibration leakage from the drive vibration arms can be restrained effectively.

Figure 9A:
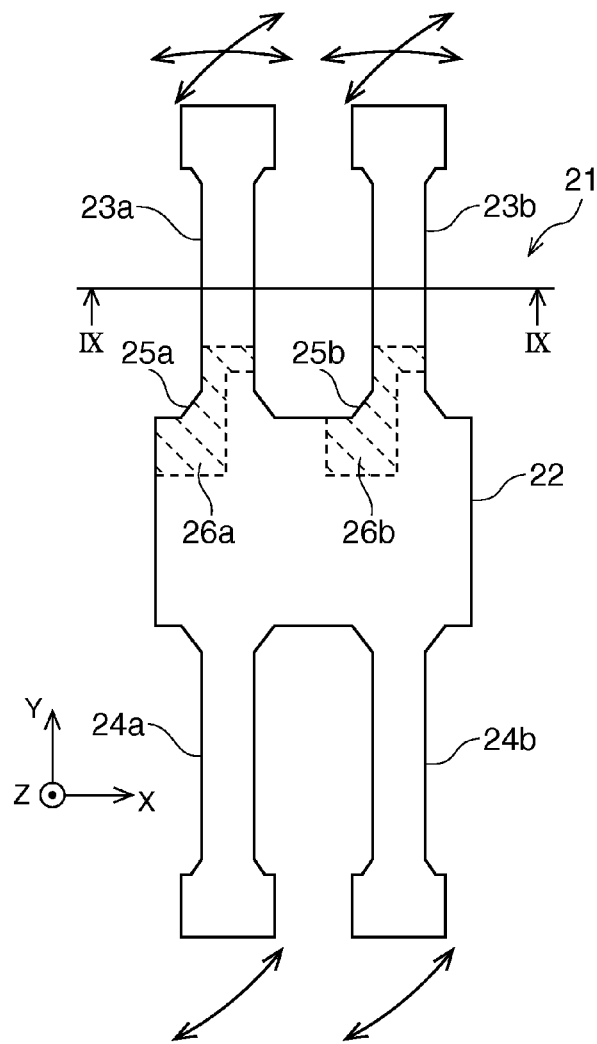
FIG. 9A is a schematic plan view showing a bending vibration piece according to a second embodiment.
Figure 9B:
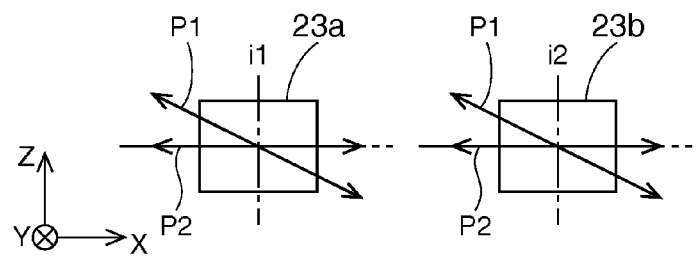
FIG. 9B is a sectional view of vibration arms, taken along line IX-IX in FIG. 9A.

FIGS. 9A and 9B schematically show a double-side tuning fork-type bending vibration piece for a piezoelectric vibration sensor according to a second embodiment of the invention. As in the first embodiment, a bending vibration piece 21 has a roughly rectangular basal part 22 at the center, a pair of drive vibration arms 23a, 23b extending parallel to each other toward one side from the basal part, and a pair of detection vibration arms 24a, 24b extending parallel to each other toward the opposite side. In connecting parts between the drive vibration arms 23a, 23b and the basal part 22, tapered portions 25a, 25b tapered toward distal ends of these vibration arms are formed on both left and right sides. In the drive vibration arms 23a, 23b, a drive electrode (not shown) is formed in order to cause the drive vibration arms to perform bending vibration within an XY plane in driving mode. In the detection vibration arms 24a, 24b, a detection electrode (not shown) is formed in order to detect a potential difference generated by bending vibration in Z-axis directions in detection mode.

Figure 10:
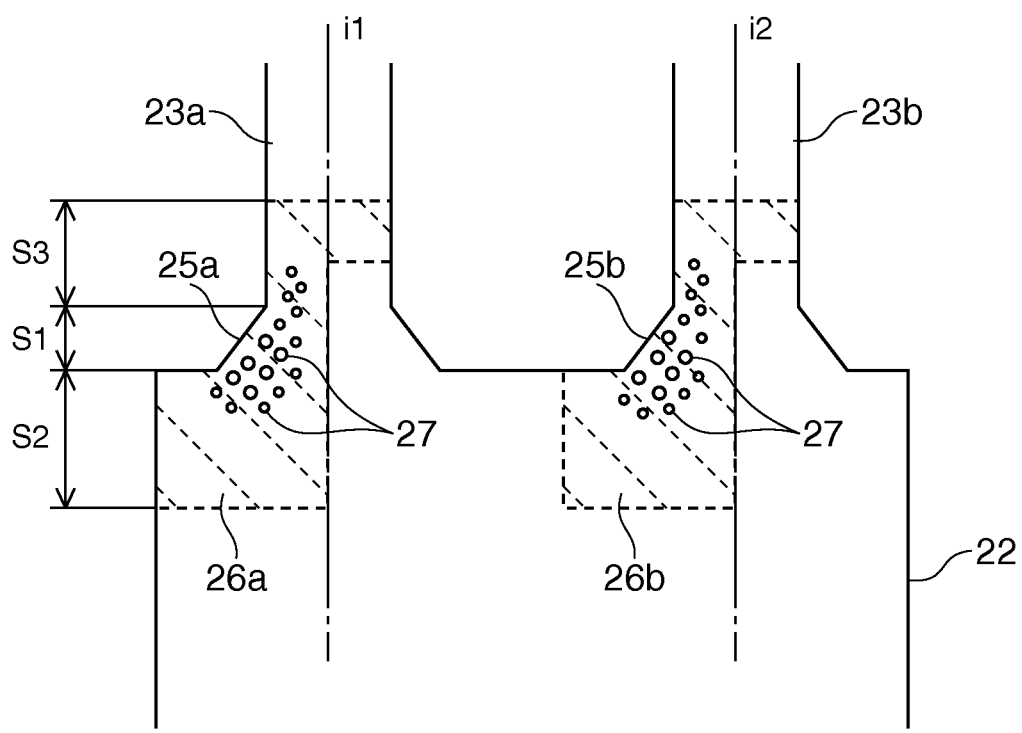
FIG. 10 is a partially enlarged plan view schematically showing essential parts of the second embodiment.

On one surface of the bending vibration piece 21, for example, on a face side thereof, adjustment areas 26a, 26b are formed respectively in the connecting areas between the drive vibration arms 23a, 23b and the basal part 22. The adjustment areas 26a, 26b are formed continuously across an area S1 of the tapered portions 25a, 25b, an area S2 of the basal part 22 near the tapered portions, and an area S3 of the drive vibration arms 23a, 23b near the tapered portions, as viewed in a longitudinal direction of the bending vibration piece 21 as shown in FIG. 10. The adjustment areas are set in substantially the same areas as the adjustment films 6a, 6b of the first embodiment. In the whole of the area S1 of the tapered portions and the area S2 of the basal part and a portion of the area S3 of the drive vibration arms, the adjustment areas are provided only to one side of vibration centers i1, i2 of the drive vibration arms, that is, to the left side in FIG. 10.

In this embodiment, the surfaces of the adjustment areas 26a, 26b are partly deleted as indicated by a number of tool marks 27 in FIG. 10. This deletion is carried out in such a way that the drive electrodes and wiring on the drive vibration arms and the electrode pads and wiring on the basal part 22 are not damaged or deleted. Such local working can be carried out by physical etching, for example, wet etching with a proper etching solution or ion beam etching.

It is assumed that when the surfaces of the adjustment areas are not deleted at all on the bending vibration piece 21, the drive vibration arms 23a, 23b in driving mode perform bending vibration in out-of-plane directions indicated by arrows P1 in FIG. 9B. In this case, in the connecting areas between the drive vibration arms and the basal part 22, concentration of internal stress occurs in diagonal directions corresponding to the bending vibration directions P1. According to this embodiment, the surfaces of the adjustment areas are deleted to reduce the mass thereof. Thus, distribution of internal stress is adjusted and concentration of internal stress is relaxed. Therefore, the direction of vibration of the drive vibration arms 23a, 23b is corrected roughly into the XY-plane, as indicated by arrows P2 in FIG. 9B, and a vibration leakage from the drive vibration arms in driving mode can be restrained effectively. The amount of restraining a vibration leakage can be adjusted by the depth of working on the adjustment area surfaces to be deleted.

The deletion of the adjustment areas is carried out while working, for example, a crystal wafer by photoetching to form a vibration element piece having the outer shape of the bending vibration piece 21, then patterning the drive electrodes, detection electrodes, electrode pads and wiring or the like on the surface thereof, then applying a test current to the drive electrodes to cause the drive vibration arms 23a, 23b to vibrate in driving mode, and monitoring a detection current outputted from the detection electrodes. The deletion can be carried out in a wafer-state, or before the bending vibration piece 21 is taken as an individual piece from a wafer, or after packaging. By carrying the deletion after packaging, influence at the time of packaging and on the packaging state can be eliminated.

According to another embodiment, the adjustment areas can be formed on both face and back sides of the bending vibration piece 21. In this case, since concentration of stress due to out-of-plane vibration of the drive vibration arms occurs corresponding to the bending vibration direction P1 as described above, the adjustment areas on the back side are arranged symmetrically with the adjustment areas 26a, 26b on the face side about the vibration centers i1, i2 of the drive vibration arms. According to another embodiment, the adjustment areas can also be set similarly to the adjustment film patterns of FIGS. 3 to 6.

The invention is not limited to the above embodiments and various modifications or changes can be made within the technical scope of the invention. For example, the double-side tuning fork-type bending vibration piece according to the embodiments can be applied to a sensor element for detecting physical quantities such as angular acceleration, acceleration and forces, other than angular velocity. Also, the invention can be applied to a tuning fork-type bending vibration piece having a pair of vibration arms extending parallel to each other from a basal part. This bending vibration piece is not limited to a rotational vibration gyro element and can also be used as a resonator for an oscillation circuit.

Also, the bending vibration piece according to the invention can be made of piezoelectric single crystals such as lithium tantalate and lithium niobate, piezoelectric materials such as piezoelectric ceramics including lead titanate zirconate, or silicon semiconductor materials, other than crystal. Moreover, the bending vibration piece according to the invention can be broadly applied as a sensor element in electronic devices such as digital still camera, video camera, navigation device, vehicle attitude detection device, pointing device, game controller, mobile phone, and head-mounted display.

The entire disclosure of Japanese Patent Application No. 2011-141480, filed Jun. 27, 2011 is expressly incorporated by reference herein.

What is claimed is:

1. A bending vibration piece comprising:
a basal part;
a vibration arm extending from the basal part, the vibration arm having a surface;
an excitation electrode for exciting the vibration arm; and
an adjustment film formed in a connecting area between the vibration arm and the basal part for adjusting distribution of internal stress generated by vibration when the vibration arm is excited, wherein
at least a part of the adjustment film is formed on the surface of the vibration arm from one edge to the other edge of the surface, and
a plurality of film vacant spots are formed in the adjustment film.

2. The bending vibration piece according to claim 1, further comprising a tapered portion tapered toward a distal end of the vibration arm, in a connecting part between the vibration arm and the basal part, wherein the adjustment film is formed in an area including at least the tapered portion.

3. The bending vibration piece according to claim 2, wherein the adjustment film is formed in an area of the tapered portion and an area of the basal part near the tapered portion.

4. An electronic device comprising the bending vibration piece according to claim 1.

5. An electronic device comprising the bending vibration piece according to claim 2.

6. An electronic device comprising the bending vibration piece according to claim 3.

* * * * *